United States Patent [19]
Tsuha

[11] Patent Number: 5,511,176
[45] Date of Patent: Apr. 23, 1996

[54] MICROCOMPUTER CAPABLE OF ACCESSING TO AN EXTERNAL MEMORY WITH LEAST POSSIBLE WAIT

[75] Inventor: Tomoko Tsuha, Tokyo, Japan

[73] Assignee: NEC Corporation, Tokyo, Japan

[21] Appl. No.: 767,784

[22] Filed: Sep. 30, 1991

[30] Foreign Application Priority Data

Oct. 1, 1990 [JP] Japan ................... 2-264351

[51] Int. Cl.$^6$ ................................. G06F 12/02
[52] U.S. Cl. .................. 395/433; 364/DIG. 1; 364/243.1; 365/222
[58] Field of Search ................... 395/425, 433, 395/431, 432, 402, 405; 365/222; 364/DIG. 1

[56] References Cited

U.S. PATENT DOCUMENTS 4,754,425  1/1988  Bhadriraju ..................... 365/222
5,027,327  6/1991  Kobayashi et al. ............. 365/222

FOREIGN PATENT DOCUMENTS

1307997  12/1989  Japan .

Primary Examiner—Eddie P. Chan
Assistant Examiner—Hiep T. Nguyen
Attorney, Agent, or Firm—Whitham, Curtis, Whitham & McGinn

[57] ABSTRACT

In a refresh pulse producing circuit of a microcomputer, an access detection section detects access to a non-refresh memory area of an external memory to produce a non-refresh memory signal indicative of the access. A pulse producing section produces a refresh pulse when supplied to a non-refresh memory signal. The refresh pulse producing circuit may comprise a timer for measuring a predetermined time interval from appearance of each refresh pulse to make the pulse producing section produce an additional pulse as one of such refresh pulses after lapse of a predetermined time interval even when the non-refresh memory signal is not produced.

2 Claims, 8 Drawing Sheets

MICROCOMPUTER CAPABLE OF ACCESSING TO AN EXTERNAL MEMORY WITH LEAST POSSIBLE WAIT

BACKGROUND OF THE INVENTION

This invention relates to a microcomputer capable of refreshing an external memory.

A microcomputer may comprise a refresh pulse producing circuit for controllably producing refresh pulses for use in refreshing an external memory which may be either a pseudo-static random access memory or a dynamic random access memory. It is known that such an external memory has refresh and non-refresh memory areas where the external memory should be refreshed at a refresh cycle and need not be refreshed, respectively.

In the manner which will later be described more in detail, the refresh pulse producing circuit comprises a refresh control circuit for successively producing refresh pulses at the refresh cycle. An allow signal register or flag produces a refresh allow signal which becomes active and inactive when the external memory should and should not be refreshed.

Although so named, the refresh pulse producing circuit is used in addition for having access to the external memory. The refresh pulse producing circuit therefore comprises a bus control circuit for supplying the external memory with an access signal indicative of access to the external memory. More particularly, the bus control circuit produces the access signal when the refresh pulse producing circuit carries out memory access to the external memory, namely, either when a program should be fetched from the external memory or when data should be read from or written in the external memory.

When the refresh pulse producing circuit of a conventional microcomputer is used, the memory access is put in a waiting state whenever collision takes place between production of the access signal and the refresh cycle while the refresh allow signal is active. This objectionably reduces the speed of operation of the microcomputer.

SUMMARY OF THE INVENTION

It is therefore an object of the present invention to provide a microcomputer capable of accessing an external memory with a least possible waiting time.

It is another object of this invention to provide a microcomputer which is of the type described and which has a high operation speed.

Other objects of this invention will become clear as the description proceeds.

According to this invention, there is provided a microcomputer which comprises a refresh pulse producing circuit for controllably producing a refresh pulse to refresh an external memory having a predetermined non-refresh memory area where the external memory need not be refreshed and in which the refresh pulse producing circuit comprises: (A) access detecting means for detecting access to the non-refresh memory area to produce a non-refresh memory signal indicative of the access to the non-refresh memory area; and (B) pulse producing means connected to the access detecting means for producing the refresh pulse when the non-refresh memory signal is produced.

DESCRIPTION OF THE PREFERRED EMBODIMENTS

Figure 1:
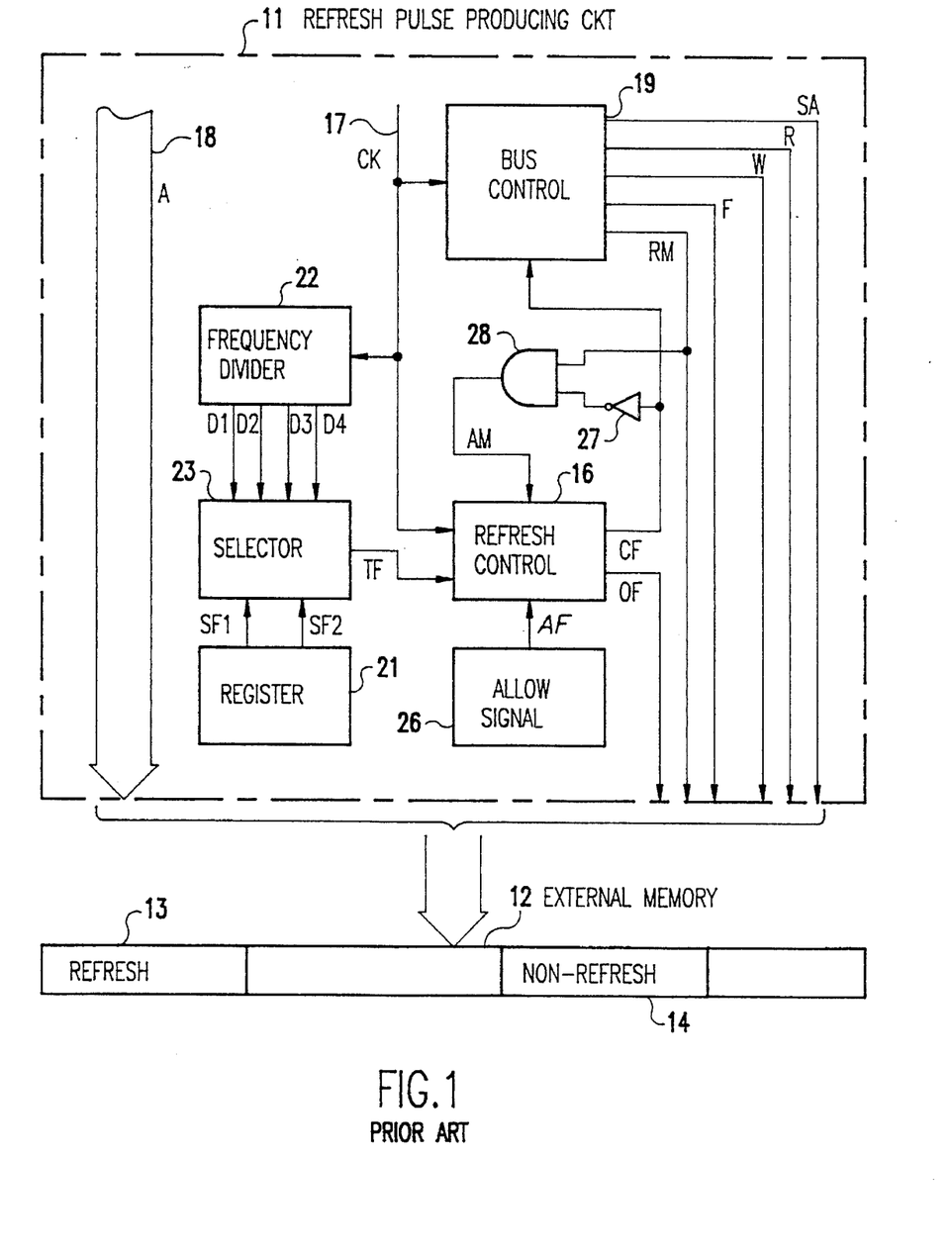
FIG. 1 is a block diagram of a refresh pulse producing circuit of a conventional microcomputer connected to an external memory.

Referring to FIG. 1, a refresh pulse producing circuit 11 of a conventional microcomputer will first be described in order to facilitate an understanding of the present invention. The refresh pulse producing circuit 11 is connected to an external memory 12 which may be either a pseudo-static random access memory or a dynamic random access memory known in general as a DRAM and which has various memory areas accessible by an address signal A representative of memory addresses of the external memory 12, namely, indicative of the memory areas. The address signal may have sixteen or thirty-two bits. As the case may be, the address signal may have only eight bits. It should be known that the refresh pulse producing circuit 11 is used also in accessing to the external memory 12, namely, in fetching a program from the memory 12, in reading data from the memory 12, and in writing dam into the memory 12.

In the manner known in the art, the memory areas are mapped in such external memories by users of the external memories. Some of the memory areas of the external memory 12 are refresh memory areas 13 where refresh of the external memory 12 is necessary. Others are non-refresh memory areas 14 where the external memory 12 need not be refreshed.

The refresh pulse producing circuit 11 comprises a refresh control circuit 16 for controllably producing a refresh pulse OF in the manner which will become clear as the description proceeds. Such refresh pulses are used in refreshing the external memory 12. The refresh pulse producing circuit 11 additionally comprises a clock delivery connection 17 through which clock pulses CK are delivered to the refresh control circuit 16 among others. It is possible to understand that the clock delivery connection 17 serves as a clock generating section of the microcomputer for generating the clock pulses at a predetermined clock period which is selected usually between one hundred nanoseconds and several hundred nanoseconds.

In the conventional microcomputer, the refresh control circuit 16 produces a refresh cycle signal CF which builds up from a low level to a high level at a refresh cycle determined as will presently be described. The refresh cycle signal is said to be active and inactive while having the high and the low levels. Typically, each clock pulse has a high level during a half of the clock period. The refresh cycle signal is active during one clock period.

In the refresh pulse producing circuit 11, an address bus 18 is for supplying the address signal A to the external memory 12. A bus control circuit 19 is supplied with the clock pulses and the refresh cycle signal and is for producing a positive-going address strobe signal SA, a negative-going read signal R, and a negative-going write signal W while the refresh cycle signal is inactive. When a program should be fetched from the external memory 12, the bus control circuit 19 supplies the external memory 12 with a fetch signal F together with the address strobe signal and the read signal. When data should be read and written, the bus control circuit 19 supplies the external memory 12 with an external memory access request signal RM together with the address strobe signal and with the read and the write signals, respectively. In each instance of program fetch and data access, the address signal is used in indicating the memory area from which the program should be fetched and at which the data should be read and written. It should be noted that the program and the data are transmitted from and to the external memory 12 through a connection which is not depicted.

A two-bit register 21 is for producing first and second refresh period selecting signals SF1 and SF2 collectively representative of one of four values at a time. The four values may be one through four. A frequency divider 22 is connected to the clock delivery connection 17 and is for frequency dividing the clock pulses by two, four, eight, and sixteen to produce first through fourth frequency divided signals D1, D2, D3, and D4. Supplied with the first and the second refresh period selecting signals and with the first through the fourth frequency divided signals, a selector 23 selects one of the frequency divided signals as a refresh timing signal TF when the refresh period selecting signals are collectively representative of a corresponding one of the four values. The refresh timing signal is delivered to the refresh control circuit 16 so as to determine the refresh cycle, It is now understood that the refresh cycle is two, four, eight, or sixteen clock periods long.

An allow signal register 26 is for supplying the refresh control circuit 16 with a refresh allow signal AF which indicates allowance and inhibition of the refresh of the external memory 12. When the refresh allow signal is active, the refresh control circuit 16 produces the refresh pulse or pulses. When the refresh allow signal is inactive, the refresh pulse is not produced.

Supplied with the refresh cycle signal from the refresh control circuit 16 through an inverter 27 and with the external memory access request signal from the bus control circuit 19 directly, an AND gate 28 produces an external memory access signal AM which becomes active and inactive in the manner which will later become clear. The external memory access signal is delivered to the refresh control circuit 16 so as to inhibit production of the refresh pulses and of the refresh cycle signal of the high level while the external memory access signal is active.

Figure 2:
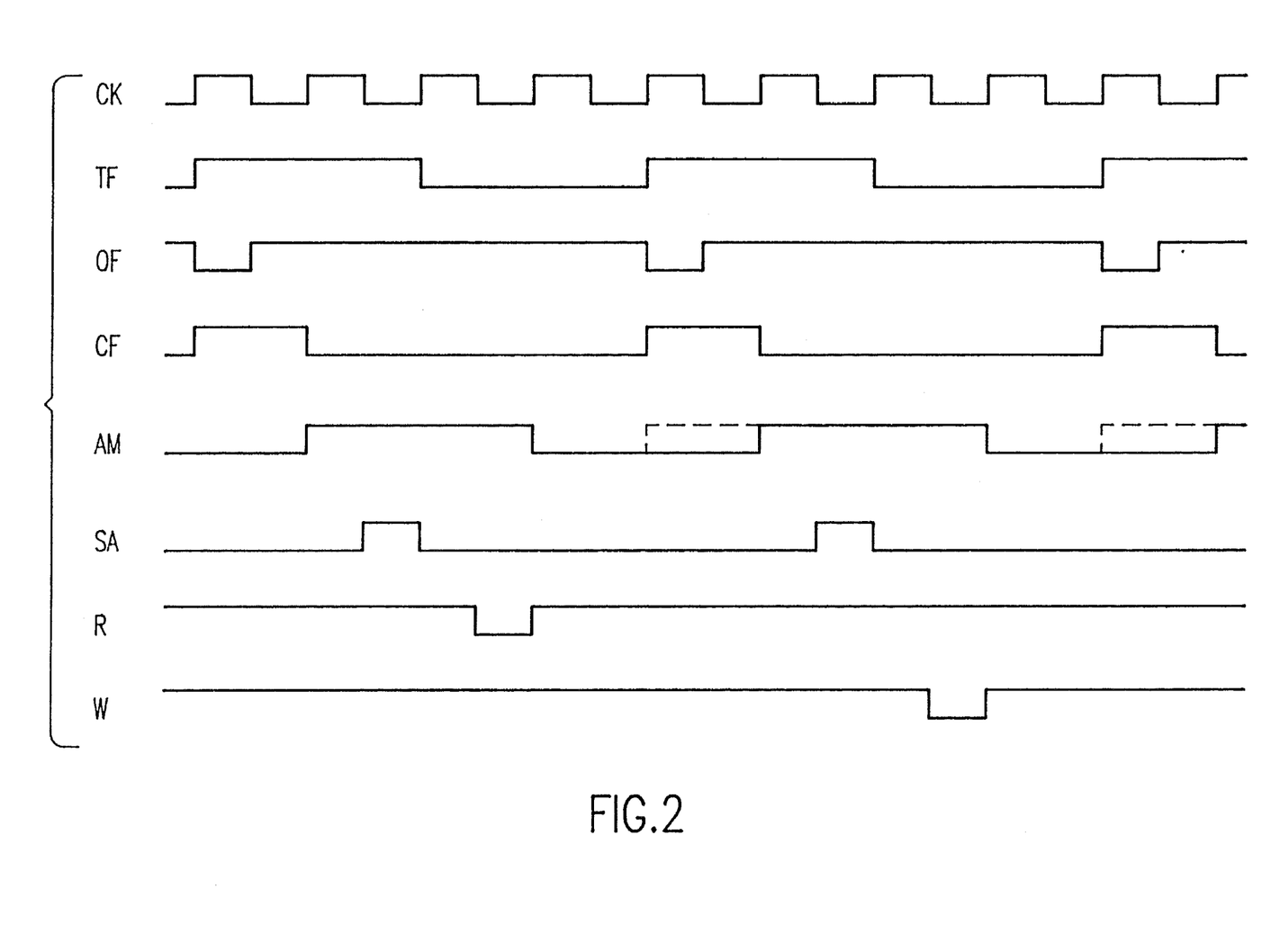
FIG. 2 is a time chart for use in describing the operation of the refresh pulse producing circuit depicted in FIG. 1.

Turning to FIG. 2 with reference to FIG. 1 continued, operation of the refresh pulse producing circuit 11 will be described. It is presumed that the refresh allow signal AF is active.

The clock pulses CK are illustrated along a top or first row. In the example being illustrated, the clock pulses define first through ninth clock periods in full. It is assumed that the first frequency divided signal is selected by the selector 23 as the refresh timing signal TF in the manner depicted along a second row. As shown along a third row, each refresh pulse OF is a negative-going pulse. In the illustrated example, the refresh pulses are produced when the clock pulses have a low level. The refresh cycle signal CF is illustrated along a fourth row. The external memory access signal AM becomes active and inactive as depicted along a fifth row.

In the example illustrated with reference to FIG. 1, it will be presumed that the address strobe signal SA should be regularly produced within the second and the fifth clock periods as first and second strobe pulses. Inasmuch as the refresh cycle signal is active throughout the fifth clock period, the second strobe pulse is kept in a waiting state and is actually produced within the sixth clock period in the manner illustrated along a sixth row together with the first strobe pulse. The read signal R is produced accompanying the first strobe pulse as shown along a sixth row. The write signal W is produced accompanying the second strobe pulse as shown along an eighth or bottom row.

Incidentally, the refresh pulses and the high-level refresh cycle signal are produced in the manner described above when the refresh allow signal is active, when the refresh timing signal is active, and furthermore when the external memory access signal is inactive. When the external memory access signal becomes active, each refresh pulse and the high-level refresh cycle signal are put in a common waiting state and are produced after the external memory access signal becomes inactive.

It will now be presumed that the external memory access signal becomes active either simultaneously with or later than a time instant at which the refresh timing signal becomes active. As soon as the refresh timing signal becomes active, the refresh pulse and the high-level refresh cycle signal are concurrently produced to keep the external memory access signal inactive. It follows therefore that the refresh pulse and the high-level refresh cycle signal are produced with a priority and with the memory access put in the waiting state.

Further turning to FIG. 3, operation of the refresh pulse producing circuit 11 will be described presuming that the refresh allow signal AF is inactive. The clock pulses CK are illustrated along a top or first row again to define first through ninth clock periods in full. In the manner depicted along a second row, the refresh timing signal TF is not different from that described in connection with FIG. 2. No refresh pulses OF are, however, produced as depicted along a third row by a solid line over a dashed line. The refresh cycle signal is kept inactive as shown along a fourth row by a solid line below a dashed line. The external memory access signal AM is therefore regularly produced in the manner depicted along a fifth row.

In the manner illustrated along a sixth row, the address strobe signal SA is produced with the high level in the second and the fifth clock periods in correct coincidence with an assumption described before. The read signal R and the write signal W are produced as depicted along a seventh and an eighth or bottom row without being put into the waiting state.

Figure 3:
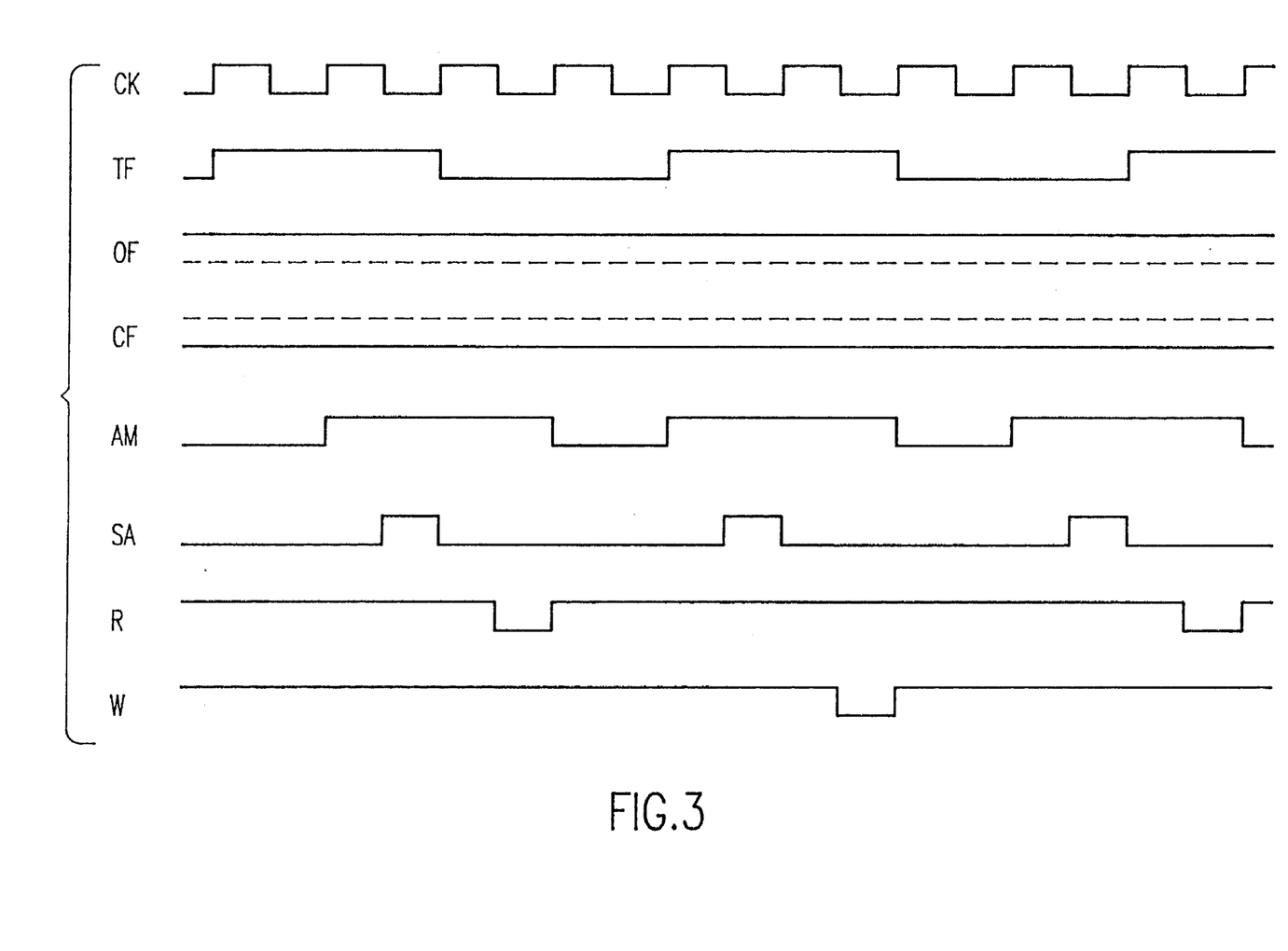
FIG. 3 is another time chart for use in describing the operation of the refresh pulse producing circuit illustrated in FIG. 1.

Reviewing FIGS. 1 through 3, it is understood in connection with the refresh pulse producing circuit 11 of the conventional microcomputer that the program fetch and the data access are put in their respective waiting states when the memory access and the refresh cycle are in collision with each other while the refresh allow signal is active. As a consequence, the memory access to the external memory 12 is slow when the refresh allow signal is active. In general, a pseudo-static random access memory is refreshed 256 times during a predetermined time interval which may be 4 milli-seconds long. Refresh is, however, carried out 512 times during the predetermined time interval in practice in consideration of possible occurrence of the collision of the memory access with the refresh cycle. If the collision takes place in each refresh cycle in the worst case and if the memory access is put in the waiting state during 500 nanoseconds, a delay of 256 microseconds is unavoidable in each predetermined time interval.

Figure 4:
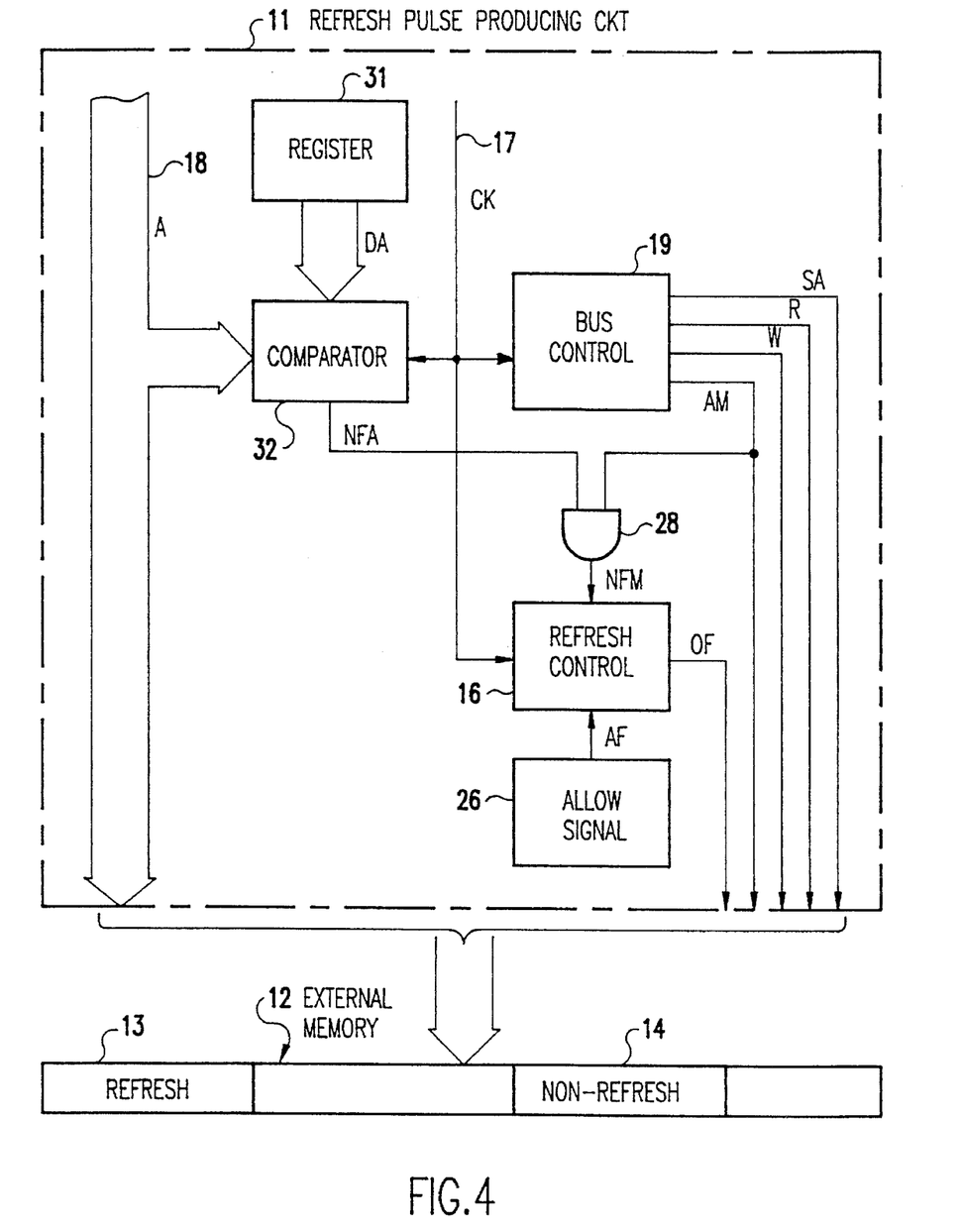
FIG. 4 is a block diagram of a refresh pulse producing circuit of a microcomputer according to a first embodiment of the instant invention.

Referring now to FIG. 4, the description will proceed to a refresh pulse producing circuit 11 of a microcomputer according to a first embodiment of the present invention. Similar parts are designated by like reference numerals. Operation is not different from that illustrated with reference to FIGS. 1 through unless 3 otherwise positively set forth.

More particularly, the refresh pulse producing circuit 11 is for use in refreshing the external memory 12 and in carrying out memory access to the external memory 12, namely, program fetch from the external memory 12 and data access relative to the external memory 12. The refresh pulse producing circuit 11 comprises the refresh control circuit 16, the clock delivery connection 17, the address bus 18, the bus control circuit 19, and the AND gate 28.

In the refresh pulse producing circuit 11 being illustrated, there is included refresh pulse generation components comprising the refresh controller 16 and an allow signal flag 26. The allow signal flag 26 is an equivalent of the allow signal register described in conjunction with FIG. 1 and is for producing the refresh allow signal AF which may take one of two states. The allow signal flag is therefore designated by the reference numeral 26. It is possible to understand the allow signal flag 26 as an allow signal producing section for producing the refresh allow signal.

A detection circuit comprises a refresh area register 31 and a comparator 32. The refresh area register 31 is preliminarily loaded with eight more significant bits of the memory addresses of a refresh memory area 13 where the external memory 12 should be refreshed. The refresh area register 31 produces an address datum DA representative of the eight more significant bits.

The address comparator circuit 32 is supplied with the clock pulses CK from the clock delivery connection 17, the address signal A from the address bus 18, and the address datum from the refresh area register 31 to compare the address datum with the memory addresses represented by the address signal. When the address signal represents the memory addresses of a non-refresh memory area 14 where the external memory 12 need not be refreshed, the address signal is incoincident with the address datum. In this event, the address comparator circuit 32 produces a non-refresh area signal NFA which indicates that the address signal represents the memory addresses of the non-refresh memory area 14. More specifically, the non-refresh area signal becomes active to indicate the non-refresh memory area 14 when the memory addresses do not indicate the refresh memory area 13. Otherwise, the non-refresh area signal is inactive.

In FIG. 4, use is not made of the refresh cycle signal described in conjunction with FIGS. 1 through 3, The bus control circuit 19 is therefore supplied with the clock pulses and is for producing the address strobe signal SA, the read signal R, and the write signal W which are never put in a waiting state. On carrying out the memory access, namely, either the program fetch or the data access, the bus control circuit 19 supplies the external memory access signal AM to the external memory 12 instead of the fetch signal and the external memory access request signal described in connection with FIG. 1.

As a result, the program is fetched from the external memory 12 by the external memory access signal, the address strobe-signal, and the read signal R. The data are read from the external memory 12 by the external memory access signal, the address strobe signal, and the read signal R. The data are written in the external memory 12 by the external memory access signal, the address strobe signal, and the write signal W.

Supplied with the non-refresh area signal and the external memory access signal, the AND gate 28 produces a non-refresh memory signal NFM which becomes active when the memory access is directed to the non-refresh memory area 14, namely, when the non-refresh memory area 14 should be accessed. Supplied with the clock pulses, the refresh allow signal, and the non-refresh memory signal, the refresh pulse producing circuit 16 produces the refresh pulse or pulses OF. The refresh control circuit 16 need not produce the refresh cycle signal in the manner pointed out above.

The eight more significant bits and consequently the address datum may alternatively be called a refresh area signal. The refresh area register 31 and the address comparator circuit 32 may be referred to simply as a register and a comparator. The register 31 is for memorizing the refresh area signal indicative of the refresh memory area 13 in which the external memory 12 should be refreshed. Connected to the address bus 18 and the register 31, the comparator 32 is for comparing the address signal with the refresh area signal to produce the non-refresh area signal indicative of the non-refresh memory area 14 when the memory addresses do not represent the refresh memory area 13.

The external memory access signal may alternatively be referred to briefly as an access signal. The bus control circuit 19 serves as a signal supplying section for supplying the external memory 12 with the access signal on accessing to the external memory 12. A combination of the register 31, the comparator 32, the signal supplying section (19), and the AND gate 28 serves as an access detecting section for detecting access to the non-refresh memory area 14 to produce the non-refresh memory signal indicative of the access to the non-refresh memory area 14.

Another combination of the allow signal producing section (26) and the refresh control circuit 16 serves as a pulse producing section, Connected to the access detecting section (31, 32, 19, 28), the pulse producing section (16, 26) is used in producing the refresh pulse or pulses when the non-refresh memory signal is produced.

Figure 5:
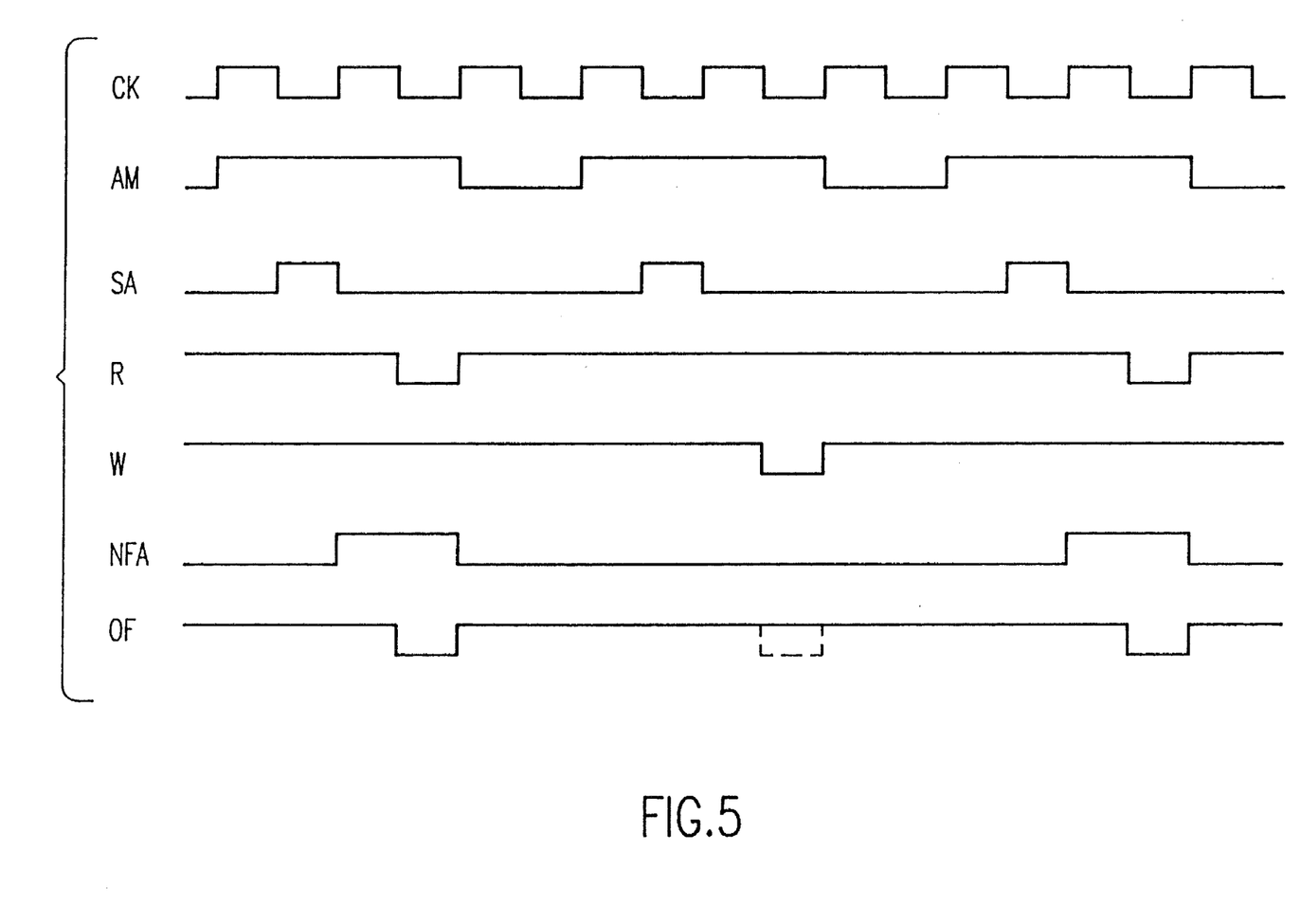
FIG. 5 is time chart for use in describing the operation of the refresh pulse producing circuit shown in FIG. 4.

Turning to FIG. 5 with FIG. 4 continuously referred to, the description will be directed to operation of the refresh pulse producing circuit 11 illustrated with reference to FIG. 4, It is herein presumed that the refresh allow signal AF is active.

The clock pulses CK are illustrated along a top or first row. In the example being illustrated, the clock pulses define first through eighth clock periods in full and about a half of a ninth clock period. It is assumed that the bus control circuit 19 produces the external memory access signal AM which becomes active and inactive during two clock periods and one clock period in the manner depicted along a second row. In order that the bus control circuit 19 is made to produce such an external memory access signal, the bus control circuit 19 may comprise a combination of the two-bit register 21, the frequency divider 22, and the selector 23 described in conjunction with FIG. 1. The selector 23 should, however, be not always operable but should be activated each time when the external memory access request occurs. In the example being illustrated, the external memory access signal very frequently becomes active. More particularly, the external memory access signal is active throughout the first and the second clock periods, the fourth and the fifth clock periods, and the seventh and the eighth clock periods. In addition, the external memory access signal is used within the bus control circuit 19 in producing the address strobe signal SA and either the read signal R or the write signal W.

The address strobe signal is illustrated along a third row. It should be clearly noted that the address strobe signal is produced without being put in a waiting state unlike the address strobe signal described in conjunction with FIGS. 1 and 2. In other words, it is possible with the refresh pulse producing illustrated to always produce the address strobe signal whenever the external memory access request occurs. It is therefore possible to carry out the memory access and refresh of the external memory 12 without the collision even while the refresh allow signal is active.

In the illustrated example, the address strobe signal has the high level within the first, the fourth, and the seventh clock periods. As depicted along a fourth row, the read signal is produced accompanying the address strobe signal in the second and the seventh clock periods. As shown along a fifth row, the write signal is produced accompanying the address strobe signal fifth clock period.

It will be surmised that the non-refresh area signal NFA is produced relatively frequently in the manner illustrated along a sixth row and becomes active during one clock period. In the illustrated example, the non-refresh area signal is active during the second and the eighth clock periods and is inactive in other clock periods. In this particular case, the non-refresh memory signal NFM (not shown in FIG. 5) becomes active and inactive while the non-refresh area signal is active and inactive.

The refresh pulse or pulses OF are produced in the manner depicted along a seventh or bottom row. In the example being illustrated, the refresh pulses are produced while the clock pulses have the low level. The refresh pulses are produced within the second and the eighth clock periods. In the fifth clock period, the refresh pulse is not produced in the manner illustrated by dashed lines as a negative-going pulse. This is because the non-refresh memory signal is inactive throughout the third through the seventh clock periods.

Figure 6:
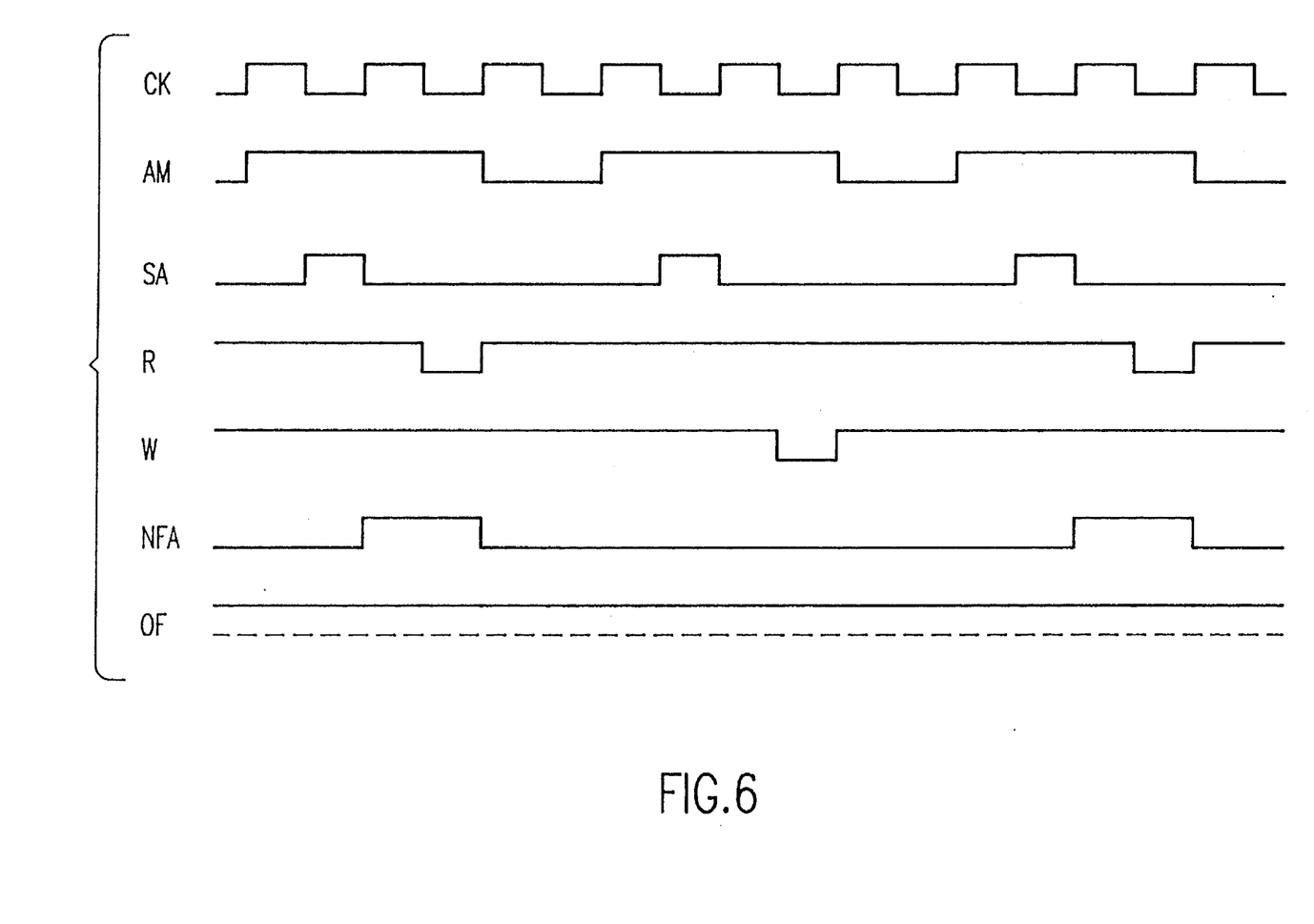
FIG. 6 is another time chart for use in describing the operation of the refresh pulse producing circuit illustrated in FIG. 4.

Further turning to FIG. 6, operation of the refresh pulse producing circuit 11 will be described presuming that the refresh allow signal AF is inactive. The clock pulses CK are illustrated along a top or first row again to define first through eighth clock periods in full and about a half of a ninth clock period. In the manner depicted along a second row, the external memory access signal AM becomes active and inactive like that described in conjunction with FIG. 5. The address strobe signal SA, the read signal R, and the write signal W are produced as depicted along third, fourth, and fifth rows. Also as shown in FIG. 5, the non-refresh area signal NFA is produced in the manner illustrated along a sixth row. As depicted along a seventh or bottom row, no refresh pulses OF are produced. This is because the refresh allow signal is inactive although the non-refresh memory signal NFM may become active during the second and the seventh clock periods in the manner described in connection with FIG. 5. Production of no refresh pulses is indicated by a solid line over a dashed line.

Figure 7:
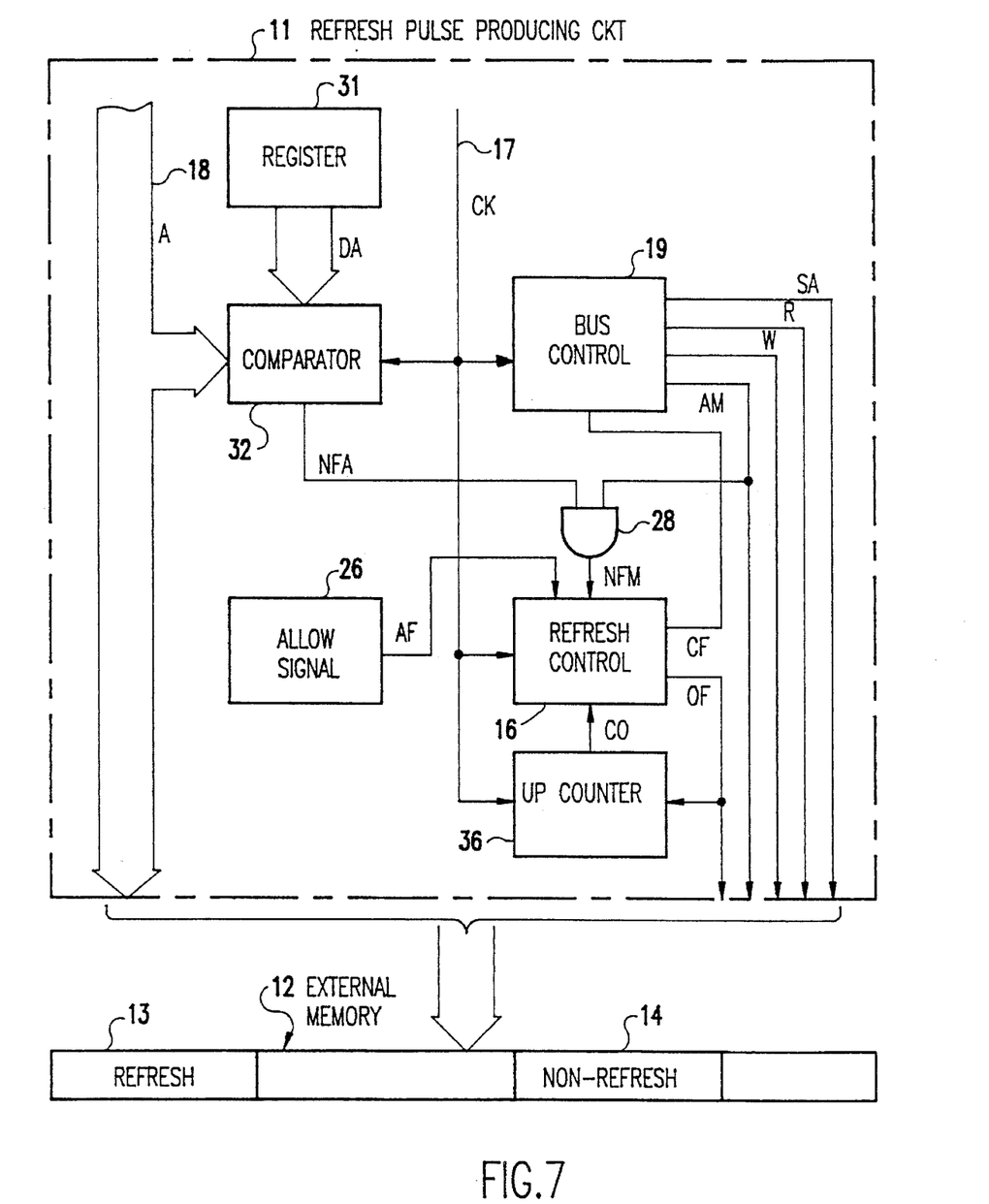
FIG. 7 is a block diagram of a refresh pulse producing circuit of a microcomputer according to a second embodiment of this invention.

Referring to FIG. 7, the description will proceed to a refresh pulse producing circuit of a microcomputer according to a second embodiment of this invention. Similar parts are designated by like reference numerals. Operation is similar to that described with reference to FIGS. 1 through 6 unless positively set forth otherwise.

In FIG. 7, the pulse control circuit 16 produces the refresh pulse or pulses-OF and additionally the refresh cycle signal CF of the type described in conjunction with FIGS. 1 through 3 in the manner which will shortly be described. Like in FIG. 1, the refresh cycle signal is used in the bus control circuit 19. More particularly, the bus control circuit 19 produces the external memory access signal AM, the address strobe signal SA, the read signal R, and the write signal W while the refresh cycle signal is inactive.

Furthermore, an up counter 36 is connected to the clock delivery connection 17 and is supplied with the refresh pulses from the refresh control circuit 16. The up counter 36 is reset by each refresh pulse to count up a current count CT one by one in compliance with the clock pulses CK and to supply the refresh control circuit 16 with an overflow signal CO which becomes active when the current count reaches a predetermined count and tends to increase beyond the predetermined count towards an excess count which is greater than the predetermined count.

The refresh control circuit 16 produces each refresh pulse and the high-level refresh cycle signal either when the refresh allow signal AF and the non-refresh memory signal NFM are both active or when the overflow signal becomes active. The up counter 36 is therefore again reset by the refresh pulse that is produced when the current count increases up to the predetermined count and towards the excess count.

Figure 8:
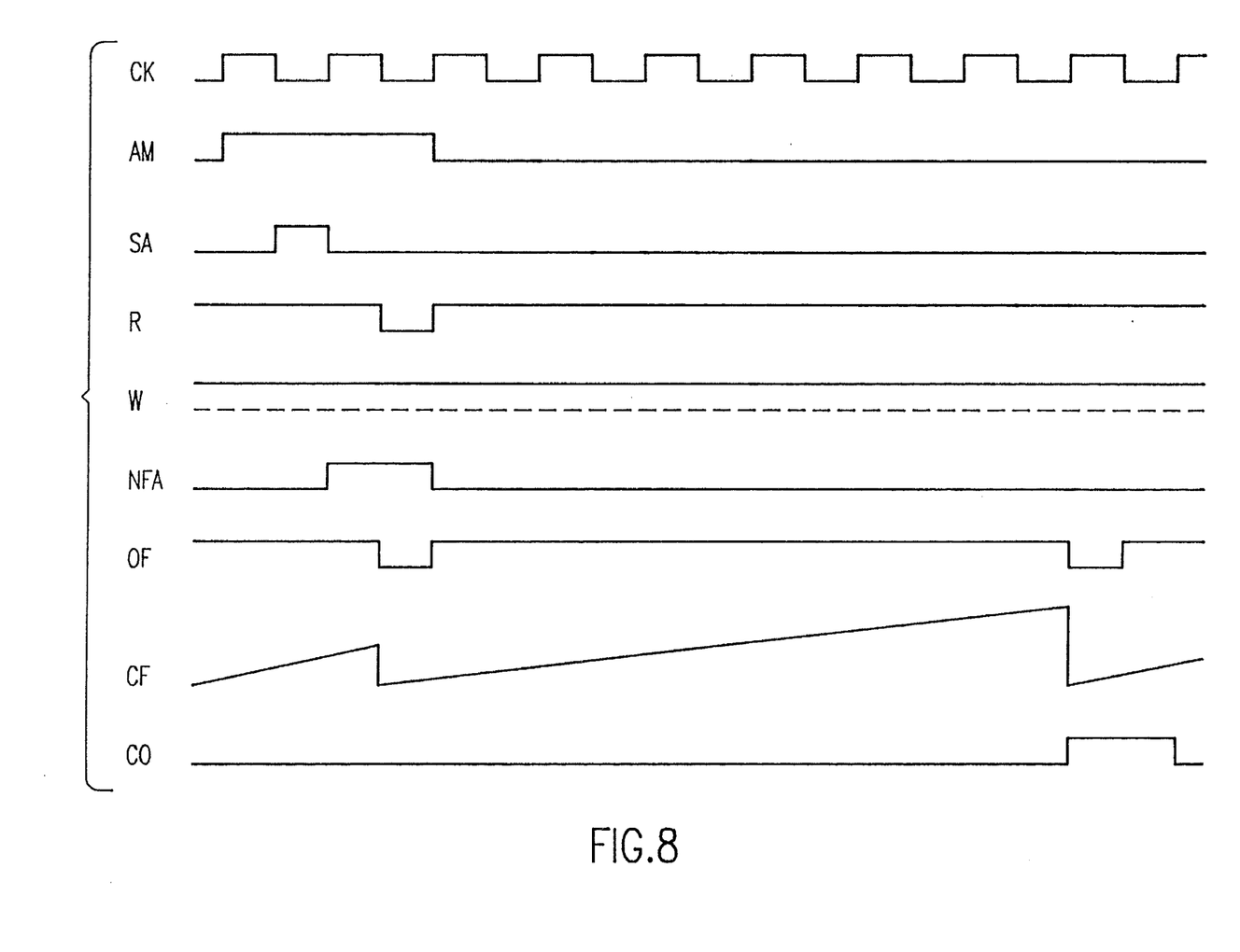
FIG. 8 is a time chart for use in describing the operation of the refresh pulse producing circuit depicted in FIG. 7.

Turning to FIG. 8 with FIG. 7 continuously referred to, operation will be described in connection with the refresh pulse producing circuit 11 illustrated with reference to FIG. 7. It is presumed in FIG. 8 that the refresh allow signal AF is active.

The clock pulses CK are illustrated along a top or first row. In the example being illustrated, the clock pulses define first through ninth clock periods in full. It is assumed in the manner depicted along a-second row that the external memory access request only occasionally occurs so that the external memory access signal AM infrequently becomes active. As for the example being illustrated, the external memory access signal becomes active only throughout the first and the second clock periods and is left inactive from the third clock period until the ninth clock period and ever more.

The address strobe signal SA is produced only within the first clock period in the manner illustrated along a third row. The read signal R is produced only in the second clock period as depicted along a fourth row. The write signal R is not produced throughout the first through the ninth clock periods and still further as shown along a fifth line by a solid line over a dashed line.

The non-refresh area signal NFA may relatively frequently be produced in the manner depicted along a sixth row during the second and seventh clock periods. If the up counter 36 were not used, the refresh pulse OF would be produced only within the second clock period as depicted along a seventh row. This is because the non-refresh memory signal NPM is produced only during the second clock period and is not produced during the seventh clock period where the external memory access signal is inactive. If produced only occasionally, the refresh pulse would leave the external memory 12 subjected to no refresh during too long a time interval. Use of the up counter 36 makes the refresh control circuit 16 produce the refresh pulse also within the ninth clock period in the manner which will be described in the following.

The up counter 36 is reset by the refresh pulse produced within the second clock period. The current count CT is reset to zero in the manner exemplified along an eighth row before reaching the predetermined count. Thereafter, the current count increases from zero as illustrated by an up-going straight line. It will herein be presumed that an increment of one appears in the current count in each half clock period and that the predetermined count is equal to thirteen. Under the circumstances, the overflow signal CO becomes active during the ninth clock period as depicted along a ninth or bottom row. This makes the refresh control circuit 16 produce an additional pulse even if the external memory access signal may be inactive in the meantime. The additional pulse serves as one of the refresh pulses.

It is now understood that the up counter 36 serves as a timer for measuring a predetermined time interval, such as thirteen half clock periods, from appearance of each refresh pulse to make the refresh control circuit 16 produce the refresh cycle signal with the high level and the additional pulse as one of the refresh pulses upon lapse of the predetermined time interval from appearance of the refresh pulse in question even though the external memory access signal may not become active in the meanwhile, namely, even when at least one of the refresh allow signal and the non-refresh memory signal may not become active meanwhile.

From a different point of view, the up counter 36 is connected to the clock pulse generating section (17) and the refresh control circuit 16 and counts up the current count in compliance with the clock pulses. The current count is reset to zero by each refresh pulse. The up counter 36 makes the refresh control circuit 16 produce the additional pulse when the current count reaches the predetermined count.

Incidentally, it should be noted in connection with the refresh pulse producing circuit 11 being illustrated that the high-level refresh cycle signal puts the memory access in the waiting state if the external memory access signal becomes active while the refresh allow signal is active. This refresh pulse producing circuit 11 is therefore excellently operable in applications where the external memory 12 is accessed at a relatively long access time interval. Such an application is, for example, execution of an instruction indicative of multiplication and/or division.

FIGS. 4 through 8 will be reviewed. It is now believed that the refresh and the bus control circuits 16 and 19 are readily implemented by one skilled in the art by modifying the refresh and the bus control circuits 16 and 19 described in conjunction with FIGS. 1 through 3. The external memory 12 should be refreshed a predetermined number of times in each predetermined time interval, such as 256 times in each four-millisecond period exemplified before, in compliance with its specification. The predetermined time interval of the timer (36) should be determined in accordance with the predetermined number of times. The comparator 32 is equivalent to a circuit for judging whether the memory addresses have greater and less values. It is known in the art that the address signal A should and need not be used in refreshing the dynamic and the pseudo-static random access memories.

While this invention has thus far been described in specific connection with only two preferred embodiments thereof, it will now be readily possible for one skilled in the art to carry this invention into effect in various other manners. For example, the refresh pulse producing circuit 11 can be used in refreshing an external memory 12 which is other than the dynamic and the pseudo-static random access memories. The external memory access signal AM and other signals may have different polarities. In FIG. 7, the pulse producing circuit 11 may comprise a switch (not shown) for manually or otherwise switching supply of the refresh cycle signal to the bus control circuit 19 and of the refresh pulses to the up counter 36 so that the circuit 11 may selectively be operable as that illustrated with reference to FIGS. 4 through 6.

What is claimed is:

1. A microcomputer coupled to an external memory unit having a first memory address area and a second memory address area, said first memory address area comprising a memory device requiring a refresh operation to retain data stored therein and said second memory address area requiring no refresh operation, said microcomputer comprising:

access means for performing a memory access operation on said external memory unit to read or write data from or into said external memory unit by supplying said external memory unit with a memory address and a read/write control signal, detection means responsive to said memory address, for detecting whether said memory address designates said first memory address area or said second memory address area each time said access means performs said memory access operation and for producing a detection signal which takes a first logic level when said memory address designates said first memory address area and a second logic level when said memory address designates said second memory address area wherein said detection means comprises:

a register for temporarily storing a refresh address indicative of said first memory address area, and a comparator for comparing said memory address with said refresh address and for producing said detection signal taking said first logic level when said memory address is coincident with said refresh address and said detection signal taking said second logic level when said memory address is not coincident with said refresh address, and refresh pulse generation means, coupled to said detection means, for generating a refresh pulse each time said detection signal takes said second logic level and for generating no refresh pulse when said detection signal takes said first logic level, said refresh pulse being supplied to said external memory unit to refresh said first memory address area, whereby said refresh pulse is generated when said memory access operation is performed on said second memory address area and no refresh pulse is generated when said access operation is performed on said first memory address area, wherein said refresh pulse generation means includes:

a control register presettable to one of a first state and a second state, and a refresh controller for generating said refresh pulse when said detection signal takes said second logic level and said control register is preset to said first state, said refresh controller generating no refresh pulse irrespective of said detection signal taking said second logic level when said control register is preset to said second state.

2. The microcomputer as claimed in claim 1, wherein said refresh pulse generation means includes a counter for counting a clock signal and reset to an initial state each time said refresh pulse is generated, said counter producing a control signal when a count value of said counter reaches a predetermined value from said initial state, said refresh pulse generation means generating said refresh pulse irrespective of said detection signal taking said first logic level when said counter produces said control signal.

* * * * *